(12) United States Patent
Spalding et al.

(10) Patent No.: US 6,984,132 B1
(45) Date of Patent: Jan. 10, 2006

(54) ELECTRICAL CONNECTOR SEMICONDUCTOR PACKAGE WITH FLY-OVER SIGNAL PATHS

(76) Inventors: Kirby H. Spalding, 2655 Aragon Way, San Jose, CA (US) 95125; Stanley M. Chang, 5612 Stevens Creek Blvd. #123, Cupertino, CA (US) 95014; Robert M. Fujioka, 48849 Semillon Dr., Cupertino, CA (US) 94539; Patrick M. Weiher, 1236 Lisa La., Los Altos, CA (US) 94024

( * ) Notice: Subject to any disclaimer, the term of this patent is extended or adjusted under 35 U.S.C. 154(b) by 13 days.

(21) Appl. No.: 10/760,605

(22) Filed: Jan. 17, 2004

(51) Int. Cl.
*H01R 12/00* (2006.01)
(52) U.S. Cl. .................................... 439/76.1
(58) Field of Classification Search .............. 439/76.1, 439/76.2, 654, 638
See application file for complete search history.

(56) References Cited

U.S. PATENT DOCUMENTS

| | | | |
|---|---|---|---|
| 4,392,701 A * | 7/1983 | Weidler | 439/76.1 |
| 5,026,293 A * | 6/1991 | Wilson | 439/76.1 |
| 6,176,743 B1 * | 1/2001 | Kuo | 439/638 |
| 6,343,957 B1 * | 2/2002 | Kuo et al. | 439/638 |

* cited by examiner

*Primary Examiner*—Neil Abrams
(74) *Attorney, Agent, or Firm*—Irene Hu

(57) ABSTRACT

An electrical connector semiconductor package with electrically conductive "fly-over" paths wherein semiconductor package hermetically seals one or more substrate comprising one or more semiconductor devices, such as active or passive ICs, and other semiconductor components. Semiconductor package with "fly-over" paths comprises a first package face comprising a first set of connector terminations, such as a set of connector pins that receive a set of incoming external signal. Semiconductor package with "fly-over" paths also comprises a second package face comprising a second set of connector termination, wherein the second set of connector terminations might comprise a set of connector pin cusps to couple to an external board or another connector. One or more of the first set of connector terminations are provided to couple a set of incoming external signals to the one or more semiconductor devices on a substrate via a set of signal pins.

5 Claims, 5 Drawing Sheets

ELECTRICAL CONNECTOR SEMICONDUCTOR PACKAGE WITH FLY-OVER SIGNAL PATHS

FIELD OF THE INVENTION

The invention relates to semiconductor packaging for integrated circuits with electrical connector connectivity.

BACKGROUND OF THE INVENTION

Typical electrical signal conduction paths to one or more integrated circuits and, or, other semiconductor devices on a substrate assembly comprises having a plurality of metal electrically conductive paths defined by a metal layer pattern on the substrate. Electrical signals are sent to the one or more devices on the substrate along the predefined electrically conductive metal paths to the targeted one or more ICs and devices as needed and the output signals from these devices are then again transmitted along yet more electrically conductive metal paths from those devices to another device on the substrate, or to an edge of the substrate to be connected to a conventional connector off the substrate.

As the real estate on a substrate continuously diminish due to increased number of components and signal paths, signal interference from these closely spaced signal paths create signal interference such as EMI, cross-talk, jitter, and other signal perturbations on the signals being transmitted along the signal paths on the substrate. These signal perturbations become increasingly significant to the integrity of the signals transmitted along the substrate as the operating frequency of the semiconductor devices on the substrate increases. In addition, very high frequency signals transmitted to the semiconductor devices are also perturbed by other electrical activities, such high or low frequency signals, reference voltage source or ground signals contributing to noise along the closely spaced signal paths of the substrate. Additionally, it would be preferable to minimize presence of high current generated by high voltage reference signals through the substrate and near semiconductor devices that also contribute to increasing signal degradation. There is therefore a need to provide improved signal conduction paths for semiconductor substrates that reduce signal degradation of signals on a substrate, while preferably also increasing routing space available on a substrate.

SUMMARY OF THE INVENTION

An electrical connector semiconductor package with electrically conductive "fly-over" paths wherein semiconductor package hermetically seals one or more substrate comprising one or more semiconductor devices, such as active or passive ICs, and other semiconductor components. Semiconductor package with "fly-over" paths comprises a first package face comprising a first set of connector terminations, such as a set of connector pins that receive a set of incoming external signal. Semiconductor package with "fly-over" paths also comprises a second package face comprising a second set of connector termination, wherein the second set of connector terminations might comprise a set of connector pin cusps to couple to an external board or another connector. One or more of the first set of connector terminations are provided to couple a set of incoming external signals to the one or more semiconductor devices on a substrate via a set of signal pins. The substrate comprises one or more semiconductor devices, each semiconductor device may comprise an active integrated circuit (IC) with various functionalities and, or, a passive IC and, or, semiconductor device or component. Each semiconductor device is physically attached to the substrate and to a first plurality of electrically conductive signal paths, such as metal conductive signal traces, on a first surface, such as the top, bottom, or both top and bottom surface of substrate.

Semiconductor package with "fly-over" paths hermetically seals one or more substrates within the package, together with the signal paths along surface of the substrate as well as the one or more fly-over signal paths. Signal pins connect one of the external signals provided at one or more of the first set of connector terminations to one or more electrically conductive signal paths along one or more surfaces of substrate. One or more "fly-over" signal conduction paths are also provided that couples a first end of the fly-over paths to the incoming external signals received at a first set of connector terminations of first package face. In a first embodiment, a second end of fly-over paths bypasses electrical contact with substrate to directly connect with one of the second set of connector terminations at a second package face. "Fly-over" paths may also comprise a dip to make an electrical contact with an electrically conductive path on the substrate, wherein on either side of the "fly-over" dip, the "fly-over" path arch away from the substrate providing a clearance, without physically contacting substrate. In the preferred embodiment, one or more "fly-over" signal paths comprise one or more of the external signals that provides supply voltages or ground, or signals that are not required for signal processing by components on substrate. Physically bypassing signals not needed thereby free up real estate, i.e., routing space, on substrate that would otherwise be located along a surface of the substrate. Additionally, supply voltage signals can induce high current through a substrate, thereby minimizing contacts of unnecessary supply voltage signals to substrate minimize adversely affecting signals that do run along the signal paths on substrate.

DETAILED DESCRIPTION

Figure 1:
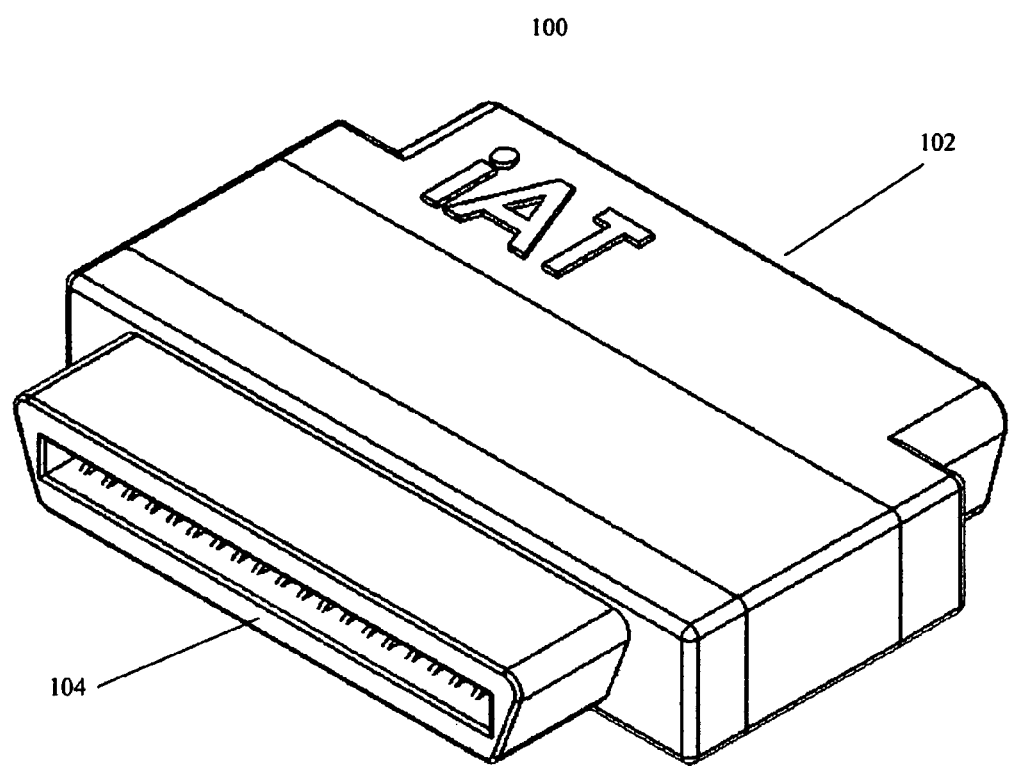
FIG. 1 illustrates an electrical connector semiconductor package with "fly-over" signal conduction paths provided in accordance with the principles of this invention.
Figure 2:
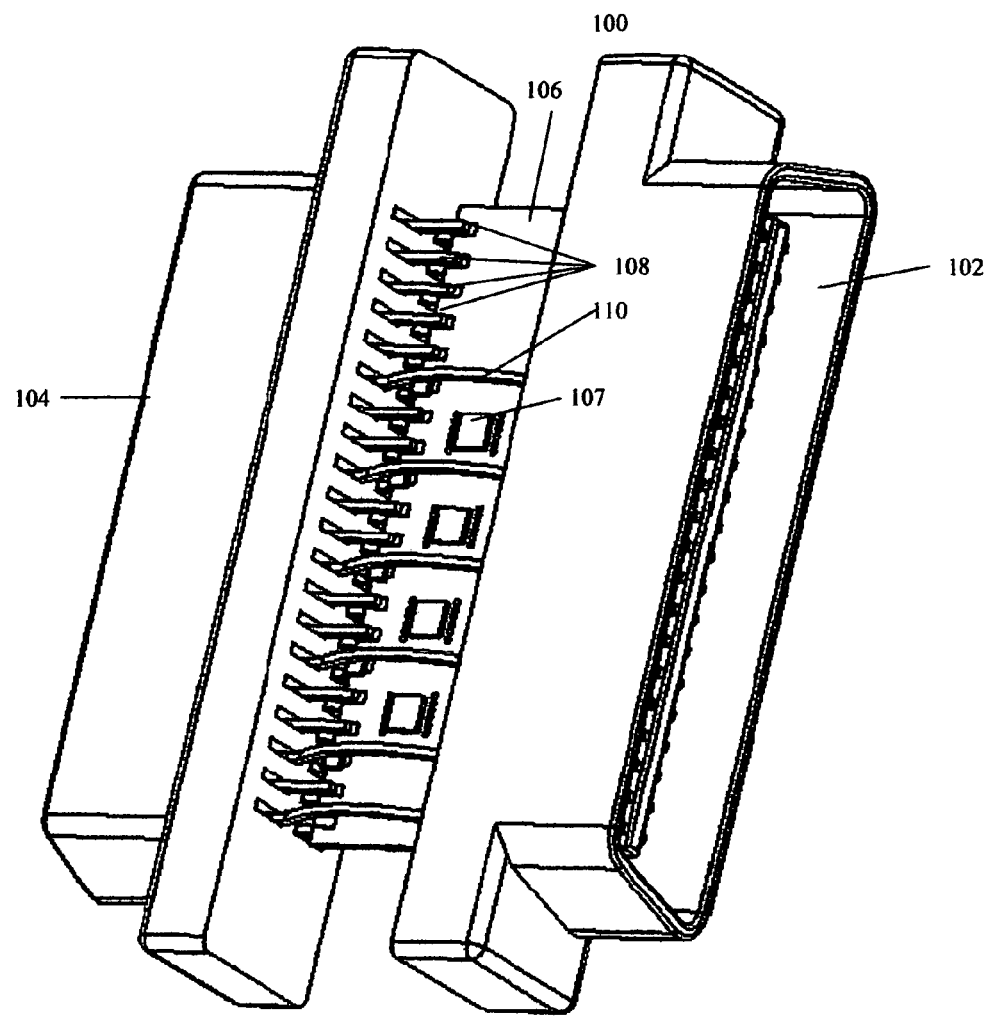
FIG. 2 illustrates a cross-sectional perspective of the semiconductor package of FIG. 1 with "fly-over" signal conduction paths.

FIG. 1 illustrates a general external perspective view of an electrical connector semiconductor package 100 with "fly-over" signal conduction paths. FIG. 2 provides a more detailed, cross-sectional perspective of the semiconductor package 100 of FIG. 1. FIG. 2 illustrates a multi-chip, electrical connector semiconductor package 100 comprising a substrate 106 having one or more semiconductor devices 107, each semiconductor device 107 may comprise an active integrated circuit (IC) with various functionalities and, or, a passive IC and, or, semiconductor device or component. Each semiconductor device 107 is physically attached to substrate 106 and to a first plurality of electrically conductive signal paths, such as metal conductive signal traces (not shown), on a first surface, such as the top, bottom, or both top and bottom surface of substrate 106. Semiconductor package 100 hermetically seals substrate 106, wherein semiconductor package 100 comprises a first package face 102 comprising a first set of connector terminations and a second package face 104 comprising a second set of connector terminations, wherein one or more of the first set of connector terminations are provided to couple a set of incoming external signals to the one or more semiconductor devices 107 via a set of signal pins 108. At one end of each signal pins 108, signal pins 108 is attached to one of the first set of connector terminations, while a second end of pins 108 are also electrically attached to one or more electrically conductive signal paths, such as metal conductive paths along one or more surfaces of substrate 106. One or more "fly-over" signal conduction paths 110 are also provided that couples a first end of the fly-over paths 110 to the incoming external signals received at a first set of connector terminations of first package face 102. In a first embodiment, a second end of fly-over paths 110 bypasses electrical contact with substrate to directly connect with one of the second set of connector terminations at a second package face 104. "Fly-over" paths 110 may also comprise a dip 112 to make an electrical contact with an electrically conductive path on substrate 106, wherein on either side of dip 112 electrically conductive path 110 arch away from substrate 106 providing a clearance, without physically contacting substrate 106. In the preferred embodiment, one or more "fly-over" signal paths 110 comprise one or more of the external signals that provides supply voltages or ground, or signals that are not required for signal processing by components on substrate 106. Physically bypassing signals not needed thereby free up real estate, i.e., routing space, on substrate 106 that would otherwise be located along a surface of substrate 106. Additionally, supply voltage signals can induce high current through a substrate, thereby minimizing contacts of unnecessary supply voltage signals to substrate 106 minimize adversely affecting signals that do run along the signal paths on substrate.

In another version of "fly-over" signal paths 110, "fly-over paths 110 may also comprise a dip 112 that allow the signal transmitted on that "fly-over" path to make an electrical connection with an electrically conductive signal path on the surface of substrate 106. Dip 112 allows "fly-over" paths to touch down and make electrical connection on substrate only where desired, while a clearance portion of "fly-over" paths 110 on either side of dip portion 112 clear substrate 106, thereby physically not contacting substrate 106.

Figure 3:
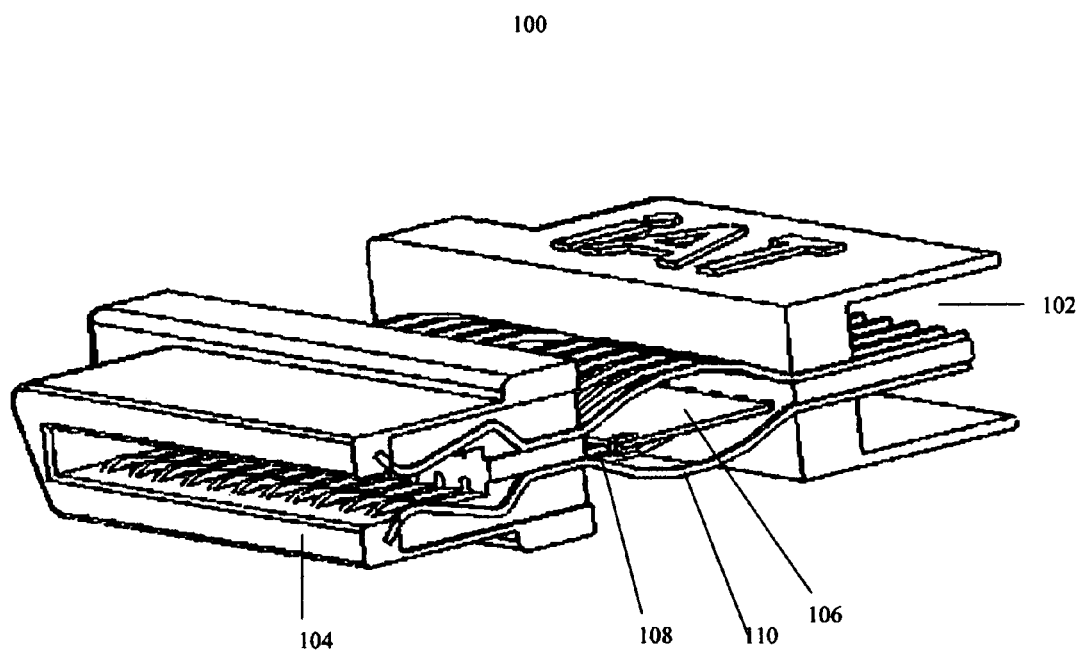
FIG. 3 illustrates a cut-away cross-sectional view of the semiconductor package of FIG. 1.

FIG. 3 illustrates a cut-away cross-sectional view of the semiconductor package of FIG. 1. As shown in FIGS. 2 and 3, semiconductor package 100 preferably comprises first semiconductor package face 102 comprises a set of male connector terminations, while a second semiconductor package face 104 comprises a set of female connector terminations. It is envisioned that electrical connector terminations 102 and 104 in the semiconductor package 100 may be of a variety of connector contact termination types. The first and second set of connector terminations may comprise, for example, any of the following form of connector terminations such as a set of connector pins, connector blades, electrically conductive bumps, electrically conductive pads, or electrically conductive receptacles or cusps. In the preferred embodiment, the first set of connector terminations comprises a set of male type connector terminations, such as a set of connector pins, while the second set of connector terminations comprises a set of female type connector terminations, such as a set of connector cusps.

Figure 4:
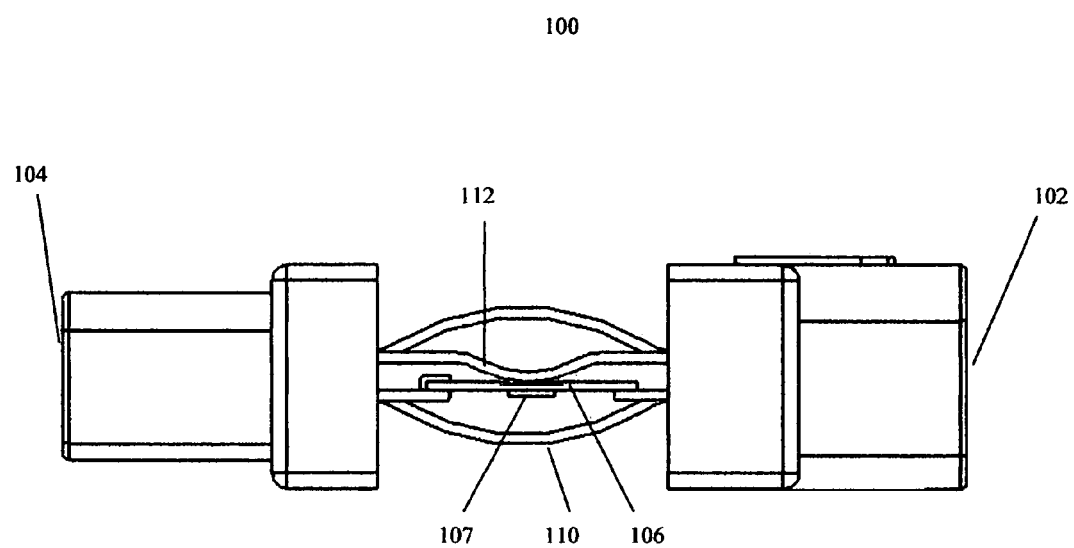
FIG. 4 illustrates a side view of the semiconductor package of FIG. 1 with electrical "fly-over" signal conduction paths.

FIG. 4 illustrates a side view of the semiconductor package of FIG. 1 with electrical "fly-over" signal conduction paths 110. One or more fly-over electrically conductive signal paths 110 are provided, wherein at least one of the fly-over signal paths 107 is coupled from one of the first set of connector terminations to one of the second set of connection terminations while bypassing a direct connection with the substrate thereby providing a clearance to substrate 106 to minimize or avoid contact of some signal paths from touching along a surface of substrate 106. The one or more semiconductor devices 107 may also be coupled to the one or more of the second set of connector terminations via one or more of the plurality signal paths that lie along a top or bottom surface of substrate 106. Those "fly-over" signal paths that do not make substrate contact, i.e. without dip 112 reduce congestion on substrate 106, thereby increasing routing space on the substrate, as well as improving integrity of signals on substrate.

Figure 5:
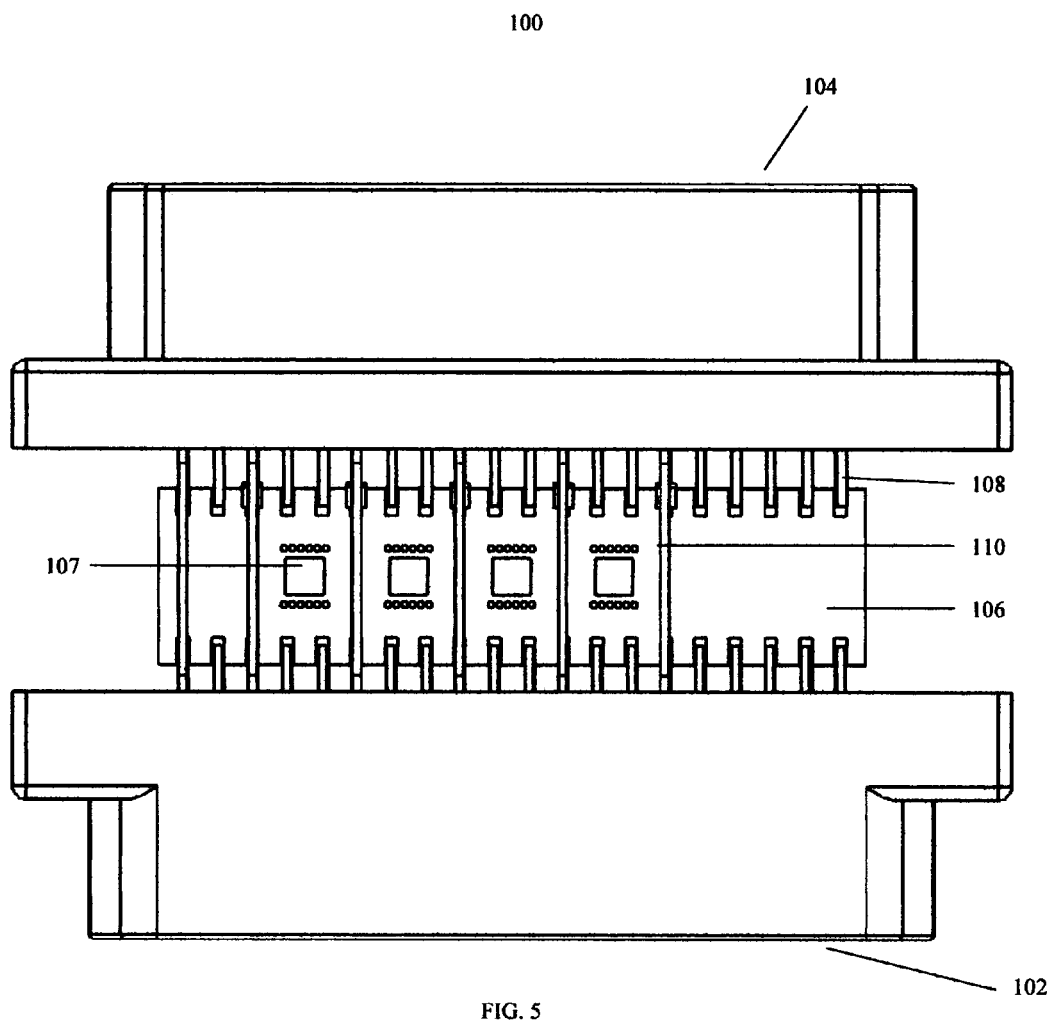
FIG. 5 illustrates a top view of the semiconductor package of FIG. 1 with "fly-over" electrical conduction paths.

As illustrates in FIG. 4, preferably semiconductor package 100 also comprises one or more of the fly-over signal paths 110 having a dip portion 112 in that fly-over signal path, wherein dip 112 makes a direct electrical contact with one of the signal paths along the substrate to electrically connect to one or more the semiconductor devices on the substrate, while a first and second portion of the fly-over signal path on either side of the dip portion comprise a curve portion providing a clearance from substrate 106. "Fly-over" dip 112 avoids substrate congestion and minimizes electrical adverse effects as electromagnetic interference (EMI), cross talk, noise, attenuation, etc. FIG. 5 illustrates a top view of the semiconductor package of FIG. 1 with fly-over electrical conduction paths. Some fly-over signal paths 110 do not make a substrate contact, while others having dip 112 may dip down to make an electrical connection with a metal conductive trace on substrate 106.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

What is claimed is:

1. An electrical connector semiconductor package comprising:

one or more substrate comprising one or more semiconductor devices attached to the substrate and a first plurality of electrically conductive signal paths provided on at least a first surface of the substrate;

a semiconductor package, wherein the semiconductor package comprises a first package face comprising a first set of connector terminations and a second package face comprising a second set of connector terminations, wherein one or more of the first set of connector terminations are provided to couple a set of external signals to the one or more semiconductor devices via one or more of the plurality signal paths on the substrate and the one or more semiconductor devices are also coupled to the one or more of the second set of connector terminations via one or more of the plurality of signal paths on the substrate;

one or more fly-over, electrically conductive signal paths, wherein at least one of the fly-over signal paths is coupled from one of the first set connector terminations to one of the second set of connector terminations while bypassing a direct connection with the substrate;

wherein the semiconductor package hermetically seals the substrate and one or more fly-over signal paths; and wherein at least one of the fly-over signal paths comprises a dip portion in that signal path, wherein the dip makes a direct electrical contact with one of the signal paths on the substrate to electrically connect to one or more of the semiconductor devices on the substrate, while a first and a second portion of the fly-over signal path on either side of the dip portion comprise a curve portion providing a clearance from the substrate.

2. The electrical connector semiconductor package of claim 1 wherein the first set of connector terminations comprises a set of connector pins, connector blades, electrically conductive bumps, electrically conductive pads, or electrically conductive receptacles.

3. The electrical connector semiconductor package of claim 1 wherein the second set of connector terminations comprises a set of connector pins, connector blades, electrically conductive bumps, electrically conductive pads, or electrically conductive receptacles.

4. The electrical connector semiconductor package of claim 1 wherein the first set of connector terminations comprises a set of male connector terminations.

5. The electrical connector semiconductor package of claim 1 wherein the second set of connector terminations comprises a set of female connector terminations.

* * * * *